United States Patent [19]

Segers

[11] Patent Number: 4,545,036
[45] Date of Patent: Oct. 1, 1985

[54] SENSE AMPLIFIER WITH TIME DEPENDENT SENSITIVITY

[75] Inventor: Dennis L. Segers, Lewisville, Tex.

[73] Assignee: Mostek Corporation, Carrollton, Tex.

[21] Appl. No.: 541,926

[22] Filed: Oct. 14, 1983

[51] Int. Cl.⁴ .............................................. G11C 11/40
[52] U.S. Cl. .................................... 365/189; 365/200
[58] Field of Search ............... 365/104, 182, 189, 230, 365/200

[56] References Cited

U.S. PATENT DOCUMENTS 4,439,804 3/1984 Riddle et al. ...................... 365/189

Primary Examiner—Terrell W. Fears
Attorney, Agent, or Firm—Eric W. Petraske

[57] ABSTRACT

A dynamic RAM integrated circuit has improved resistance to soft errors caused by alpha particles by changing the trip-point voltage of the sense amplifier from a first value that provides resistance to bit line errors to a second, lower value that provides resistance to cell errors.

4 Claims, 3 Drawing Figures

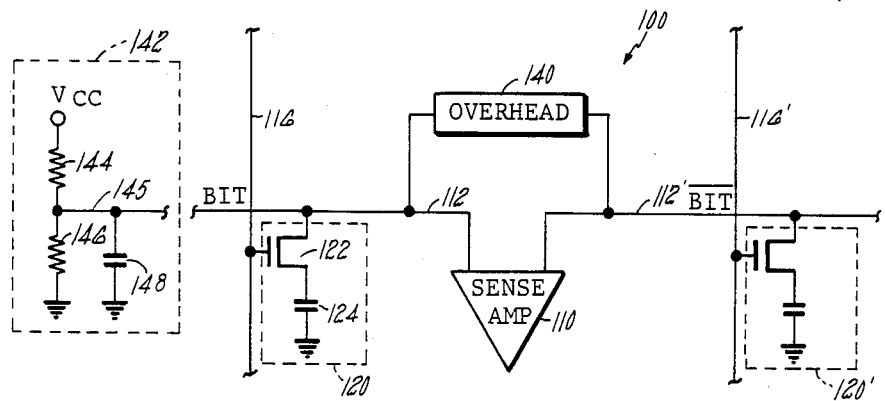
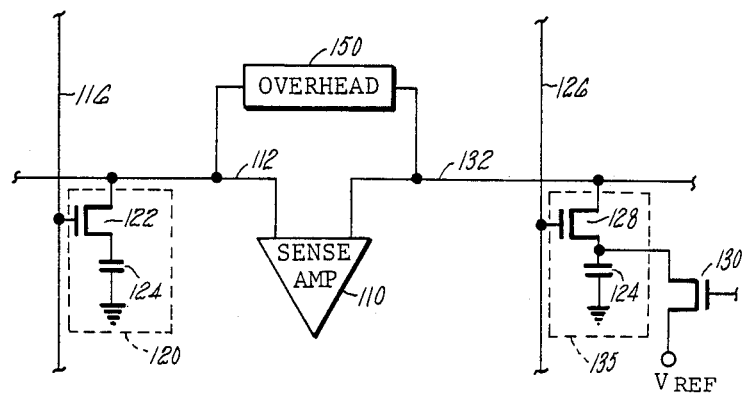
FIG. 2

SENSE AMPLIFIER WITH TIME DEPENDENT SENSITIVITY

DESCRIPTION

1. Technical Field

The field of the invention is that of integrated circuit dynamic random access memories, in particular memories having a high density that are susceptible to errors caused by alpha particles.

2. Background Art

Conventional dynamic RAMs contain an array of individual memory cells that consist of a capacitor connected and coupled to a bit line by a transistor. In operation, the selected memory capacitor is connected to the bit line, thereby raising or lowering the voltage on the bit line slightly depending on the data previously stored in the cell. A sense amplifier is connected to the bit line and to a voltage reference. The sense amplifier produces a standard-level output that indicates whether the bit line has gone up or down in voltage.

In present-day memories, the size of the individual memory cells is so small that the capacitance of one cell is typically less than one-tenth of the distributed capacitance of a bit line, so that the voltage change on the bit line produced by the cell is quite small. The amount of charge flowing to or from the cell is now comparable in magnitude to the charge deposited by an alpha particle as it passes through a bit line or a cell. Thus, there is potential for an error, in which data is incorrectly read as a result of additional charge deposited in the circuit by the effect of an alpha particle.

It is known that the main sources of errors are the cells and the bit lines. It is also known that the behavior of these two devices differs in that a bit line may produce both a "pick", in which data that should be a zero is misread as a logical one; and also a "drop", in which data that should be read as a logical one is misread as a zero. Cells are only subject to drop errors. The prior art has attempted to reduce susceptibility to alpha particle errors by a variety of techniques including: (a) blocking the entry of alpha particles by suitable protective layers; (b) reducing the charge collected on sensitive nodes by a variety of electrical deflection techniques; (c) decreasing the sensitivity of the nodes by increasing the minimum amount of charge required to cause an error (the "critical charge"). This may be done by increasing the voltage stored on the individual memory cells or increasing the capacitance of a memory cell. All of these foregoing prior art methods compliment the subject invention and may be used together with it.

SUMMARY OF THE INVENTION

The invention relates to a dynamic RAM circuit in which the trip-point of the sense amplifier; i.e. the voltage relative to which the voltage on a selected bit line is compared, is varied as a function of time from an initial value that is selected to produce optimum resistance to bit line errors to a final value that is selected to reduce sensitivity to cell errors.

BRIEF DESCRIPTION OF DRAWINGS

FIG. 1a illustrates schematically a portion of a dynamic RAM showing a sense amplifier and associated bit lines.

FIG. 1b illustrates a voltage controlled device according to the invention.

FIG. 2 illustrates a sense amplifier and associated bit lines in an alternate embodiment of the invention.

BEST MODE OF CARRYING OUT THE INVENTION

FIG. 1a illustrates schematically a portion of a dynamic RAM employing a complementary bit line architecture, as it is referred to in the field. In this figure, a portion of two bit lines 112 and 112' are connected to sense amplifier 110. Sense amplifier 110 is a conventional sense amplifier, one suitable version of which is illustrated in U.S. Pat. No. 3,967,252, incorporated herein by reference, issued to Robert M. Donnelly and assigned to the assignee hereof. Many other sense amplifiers may be used in the present invention, which is not confined to any particular form of sense amplifier.

Bit line 112, is connected to a number of memory cells one of which is indicated by the numeral 120 and comprises transistor 122 connected to capacitor 124, forming a conventional one transistor—one capacitor memory cell. Transistor 122 is controlled by wordline 116. A complementary bit line 112' contains a similar memory cell 120' and is controlled by a similar row line 116'. A portion of the remainder of the dynamic RAM is indicated by the rectangle labelled overhead and indicated by the numeral 140, which is connected to both bit lines 112 and 112'. Overhead circuit 140 represents those other portions of the dynamic RAM that are connected to the bit line, serving the functions of decoding the address, selecting the column lines, restoring full levels back into the cell after a read operation and the like. In particular, circuit 140 will form a connection between bit lines 112 and 112' at a certain time during the memory cycle in order to ensure that the voltages on these two bit lines are exactly equal before the selected memory cell is connected to one or the other bit line in order to have its state sensed. This operation is referred to as equilibration. Different forms of overhead circuitry are used by different designers in current dynamic RAMs. No particular form of overhead circuitry is implied or is necessary for the practice of this invention.

After the preliminary overhead work has been done, and the two bit lines 112 and 112' are forced equal in voltage (to 2.5 volts, say) the selected memory cell, illustratively cell 120, is connected to bit line 112. If cell 120 is storing a logical one, capacitor 124 will have been charged to a standard voltage, such as 5 volts, and the voltage preset on bit line 112 will be increased as a result of the connection, the amount of the voltage change being dependent on the relative magnitudes of the capacitance of capacitor 124 and the stray capacitance of bit line 112. Correspondingly, if cell 120 is storing a logical zero, capacitor 124 will be at zero volts and the voltage on bit line 112 will decline slightly.

In present day RAMs, full advantage is taken of the sensitivity of conventional sense amplifiers and the voltage changes between a logical one and a logical zero are quite small, being on the order of 0.1 of a volt or so. This great sensitivity, however, has resulted in increased sensitivity to small charges that may be released in the substrate by the action of an alpha particle and wind up on a cell or a bit line.

There is a difference in the sensitivity of cells and bit lines. If an alpha particle strikes near bit line 112, electrons will be attracted to it, as it is maintained at an intermediate voltage in the range of +2 to +3 volts and that voltage will be slightly reduced as a result of the electrons attracted to it. The bit line will be sensitive only when it is floating, not when it is maintained at a fixed potential, of course. A pick error may be produced by an alpha hit on bit line 112' when cell 120 connected to bit line 112 is storing a logical zero. When the sense amplifier reads the voltages on bit lines 112 and 112' bit line 112 will fall from its nominal value of 2.5 volts down to 2.35 volts. If the voltage on bit line 112', which should have been maintained at 2.5 volts, falls to 2.30 volts as a result of the attraction of electrons, generated by an alpha particle, then sense amplifier 110 will produce a signal indicating that the voltage on bit line 112 is higher than that of bit line 112' and the remainder of the circuit will interpret that to mean that a logical one was stored on cell 120.

Similarly, a drop error may be caused by an alpha particle striking near bit line 112 when memory cell 120 has stored a logical one. Ordinarily, a logical one would result in a drain of electrons from bit line 112 into capacitor 124 and the corresponding rise in voltage on bit line 112. If enough electrons are attracted to bit line 112 to balance the electrons drawn off into capacitor 124, then the voltage on bit line 112 will not rise but will fall and the remainder of the dynamic RAM will produce a signal indicating that there was a logical zero stored in cell 120.

During the operation of a RAM, the cells are left isolated and floating for nearly all the time. The bit lines however, are held at a fixed voltage for most of the time, so that the vulnerability of the cells and the bit lines to alpha errors is different. When the bit lines are held at a constant voltage, it makes no difference if they are hit by alpha particles or not, because the excess charge deposited by the alpha particles is simply absorbed by the circuits which maintain the potential. The particular ratios of bit and cell error rates will depend on a particular circuit design, of course, but for conventional RAM designs the bit error rate is much larger, as much as a factor of 100 larger than the cell error rate. Since the bit lines are vulnerable to alpha particle errors only during the relatively short period when they are left floating, the bit line error rate will fall as the cycle time increases. The two rates become equal at a memory cycle time of approximately one microsecond.

It is useful to introduce the concept of critical charge which is defined as the minimum charge deposited by an alpha particle that will cause an error rate of a specified type. In a particular RAM design such as that illustrated in FIG. 1a, in which the data is stored in cells at 5 volts and the bit lines are set equal to 2.5 volts before the state of the cell is sensed, the critical charge may be expressed as:

$$Q \text{ crit} = (V \text{ stored} - V \text{ bit line}).C \text{ cell}$$
$$= (5 - 2.5).C \text{ cell}$$

With the value of the stored voltage and the cell capacitance being set by the initial circuit design, it can be seen that the critical charge depends directly on the voltage on the bit lines; i.e. if the preset voltage on the bit lines (the trip voltage) is changed to a lower value then the critical charge will be increased and the circuit will become more resistant to alpha particle errors. As is noted above, the gist of the invention is the change in trip line voltage as a function of time in order to provide optimum insensitivity to alpha particle errors for both bit lines and cells.

Referring now to FIG. 1b, there is shown a simple voltage divider indicated generally by the numeral 142, in which resistors 144 and 146 are connected in series to ground. Capacitor 148 represents the "latch node" capacitance or the sum of the capacitance of all of the bit lines. This circuit 142 may be part of the overhead circuits 140.

In the operation of the RAM, the bit lines 112 and 112' will be set equal to each other and to a fixed value of voltage which will be determined as specified below and will be different from the voltage set by voltage divider 142. As time goes on the voltage divider 142, which has an RC time constant in the order of 1 microsecond will change the value of the voltage on the bit lines (the trip voltage of the sense amplifier) to a second value set by the ratios of resistors 144 and 146. This is a simple voltage alteration circuit used for purposes of illustration that is adequate for state of the art dynamic RAMs. Circuit designers may prefer to use more elaborate voltage circuits but the principle of operation remains the same regardless of the details of the voltage reference circuit.

A suitable initial value for the trip-point may be calculated with reference to the following example: the capacitance of the bit line 112 and 112' are each ten times the capacitance of a memory cell and the architecture is that of FIG. 1a. For a pick error, assume cell 120 has a logical zero stored in it. The charge deposited on bit line 112' by an alpha particle which will cause the output of cell 120 to be misread as a logical one is to be calculated. With a logical zero stored in the cell, the connection of cell 120 to bit line 112 will cause the voltage on bit line 112 to drop slightly from its initial value. If the excess electrons deposited by the alpha particle on bit line 112' drop the voltage on line 112' to a voltage lower than that on bit line 112, then sense amplifier 110 will incorrectly signal that there was a logical one on cell 120. The voltage drop on bit line 112 will be that caused by increasing the capacitance from 10 C to 11 C and distributing the same charge over that increased capacitance. Mathematically, $$Q \text{ crit} = (C \text{ bit}) \cdot (\Delta V)$$
$$= 10C \cdot \text{Vlatch} \cdot (1 - 10 C/11 C)$$
$$= .91C \cdot \text{Vlatch}$$

In the case of a drop error in which an alpha particle strikes bit line 112 at a time when cell 120 is to be read and cell 120 has a logical one, represented by a voltage of 5 volts, stored on it, the connection of cell 120 to bit line 112 will result in an increased voltage on bit line 112. In this case, electrons will flow from bit line 112 on to capacitor 124 until the voltage on bit line 112 reaches a new, slightly higher value. In order to prevent the voltage on bit line 112 from rising, the charge supplied by the alpha particle must be equal to the capacitance of cell 120 times the normal voltage difference caused by reading a logical one.

$$Q \text{ crit} = C \cdot (5 - \text{Vlatch})$$

Thus, for picks, critical charge increases directly proportional to the latch voltage or trip-point of sense amplifier 110. For drops, the critical charge decreases as the latch point increases. Since the sensitivity to alpha particle errors and the soft error rate depends on the critical charge, it is apparent that for bit lines the optimum balance between pick and drop errors is approximately half the supply voltage.

For cells, the optimum point for alpha insensitivity is lower than that.

The cycle time of a chip is set by the user and will depend upon the system configuration in which it was used. The chip may be accessed as fast as possible—about 200 nanoseconds for state of the art chips—in which case bit errors will dominate as the approximately 40 nanosecond float time during which the bit lines are sensitive to alpha errors will be a significant fraction of the total cycle time. In that case, the trip voltage will be set at 2.5 volts in order to provide an optimum balance between bit line picks and drops.

In a large system, however, there may be an average cycle time of as much as 50 microseconds, so that the bit line errors are effectively unimportant and the dominant error source is the cells. A single chip will have been quiescent for a considerable time between accesses, during which time there may have been a number of alpha particle hits on cells that have resulted in lowering the cell voltage to a value which is marginal, i.e. that would cause an incorrect reading if the trip-point were to remain at 2.5 volts but may be salvaged and still provide a correct reading if the trip voltage is reduced. In that case, the circuit of FIG. 1b comes into play as it reduces the reference voltage for the bit lines as a function of cycle time. When the chip is accessed, the bit lines will be equilibrated during the precharge time just before the sensing of the cell, and the voltage value to which the bit lines are set will be determined by the voltage reference circuit of FIG. 1b or an equivalent.

Referring now to FIG. 2, there is an alternate chip architecture that employs a dummy cell in which the active cells of the memory are connected to bit line 112 as before. On the right-hand side of the figure, however, bit line 132 is connected to a dummy memory cell indicated by the numeral 135. This dummy cell includes transistor 128, the same as transistor 122, capacitor 124 having the same capacitance as a standard memory cell capacitor and a second transistor 130 which is connected to a voltage reference source, such as that of FIG. 1b. In the operation of a memory cell of this configuration, the bit lines are set equal at approximately Vcc and the bit line 132 is always accessed by enabling dummy wordline 126 to read-out a reference voltage from capacitor 124. This reference voltage will be Vcc/2 at first for short cycle times, decreasing as before to a value suitable for providing protection against cell errors.

The preferred trip voltage to reduce the number of cell errors is based on a compromise between the maximization the cell's "critical charge" and the need for the sense amplifier to accurately detect a stored zero. The designer may not reduce the trip-point indefinitely, because a margin must be allowed to ensure reliable sensing of stored logic zero.

Fortunately, it has been found that a small change in critical charge results in a very large change in the soft error rate. Experimental data has shown as much as a tenfold decrease in the soft error rate for each 0.1 volt reduction in the trip voltage, so that it is not necessary to press the margins too hard. The preferred change for contemporary RAM's having a 5 volt logic level is to set the short cycle trip voltage at 2.5 volts and the long cycle trip voltage at 2.3 volts, thus achieving a two order of magnitude improvement in the soft error rate without compromising the benefits of small device size.

I claim:

1. An integrated circuit memory comprising:
   a plurality of memory cells; and
   a sense amplifier having first and second inputs, at least one of which is connectable through a bit line to at least one of said plurality of memory cells, for producing an output dependent on an input voltage difference between a cell voltage on that one of said first and second inputs connected to a selected memory cell and a reference trip-point voltage on the other of said first and second inputs; characterized in that:
   said reference trip-point voltage is controlled by time-dependent voltage control means to change over a predetermined time period from a first reference trip-point voltage after equilibration of said first and second inputs to a second reference trip-point voltage.

2. An integrated circuit according to claim 1, in which said first reference trip-point voltage is substantially midway between ground and a supply voltage and said second reference trip-point voltage is closer to ground than said first reference trip-point voltage.

3. An integrated circuit according to claim 2, in which both of said first and second inputs are connectable through at least first and second bit lines to predetermined memory cells, one of said first and second bit lines carrying said cell voltage and the other of said first and second bit lines carrying said reference trip-point voltage.

4. An integrated circuit according to claim 2, in which said reference trip-point voltage is supplied by a dummy memory cell connected to said other of said first and second inputs, said dummy memory cell further comprising a dummy capacitor and means for charging said dummy capacitor to a predetermined dummy reference voltage.

* * * * *